(12) United States Patent
Rocha-Alvarez et al.

(10) Patent No.: US 10,128,118 B2
(45) Date of Patent: Nov. 13, 2018

(54) BOTTOM AND SIDE PLASMA TUNING HAVING CLOSED LOOP CONTROL

(71) Applicant: Applied Materials, Inc., Santa Clara, CA (US)

(72) Inventors: Juan Carlos Rocha-Alvarez, San Carlos, CA (US); Amit Kumar Bansal, Sunnyvale, CA (US); Ganesh Balasubramanian, Sunnyvale, CA (US); Jianhua Zhou, Campbell, CA (US); Ramprakash Sankarakrishnan, Santa Clara, CA (US); Mohamad A. Ayoub, Los Gatos, CA (US); Jian J. Chen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 707 days.

(21) Appl. No.: 14/033,947

(22) Filed: Sep. 23, 2013

(65) Prior Publication Data
US 2014/0087489 A1    Mar. 27, 2014

Related U.S. Application Data

(60) Provisional application No. 61/726,836, filed on Nov. 15, 2012, provisional application No. 61/706,101, filed on Sep. 26, 2012.

(51) Int. Cl.
*H01J 37/32* (2006.01)
*H01L 21/30* (2006.01)

(52) U.S. Cl.
CPC ........ *H01L 21/30* (2013.01); *H01J 37/32091* (2013.01); *H01J 37/32532* (2013.01)

(58) Field of Classification Search
CPC .......... H01J 37/32091; H01J 37/32532; H01L 21/30
See application file for complete search history.

(56) References Cited

U.S. PATENT DOCUMENTS

| 6,259,334 B1 * | 7/2001 | Howald | H01J 37/32183 315/111.21 |
| 6,708,123 B2 * | 3/2004 | Gerrish | H01J 37/32082 324/95 |

(Continued)

FOREIGN PATENT DOCUMENTS

| CN | 101073085 A | 11/2007 |
| CN | 102054650 A | 5/2011 |

(Continued)

OTHER PUBLICATIONS

Chinese Office Action dated Aug. 19, 2016, for Chinese Patent Application No. 2013800494202.

(Continued)

*Primary Examiner* — Yuechuan Yu
(74) *Attorney, Agent, or Firm* — Patterson + Sheridan LLP

(57) ABSTRACT

An apparatus for plasma processing a substrate is provided. The apparatus comprises a processing chamber, a substrate support disposed in the processing chamber, and a lid assembly coupled to the processing chamber. The lid assembly comprises a conductive gas distributor coupled to a power source. A tuning electrode may be disposed between the conductive gas distributor and the chamber body for adjusting a ground pathway of the plasma. A second tuning electrode may be coupled to the substrate support, and a bias electrode may also be coupled to the substrate support.

18 Claims, 3 Drawing Sheets

(56) References Cited

U.S. PATENT DOCUMENTS

| | | |
|---|---|---|
| 7,683,289 B2 | 3/2010 | Dhindsa et al. |
| 8,299,390 B2 | 10/2012 | Dhindsa et al. |
| 8,563,619 B2 | 10/2013 | Dhindsa et al. |
| 2004/0144490 A1* | 7/2004 | Zhao .................. C23C 16/4405 156/345.47 |
| 2006/0005928 A1* | 1/2006 | Howald ............ H01J 37/32082 156/345.48 |
| 2007/0023398 A1 | 2/2007 | Kobayashi et al. |
| 2009/0236214 A1* | 9/2009 | Janakiraman ..... C23C 16/45565 204/164 |
| 2010/0297347 A1* | 11/2010 | Vellaikal ............. H01L 21/6831 427/248.1 |
| 2011/0294303 A1* | 12/2011 | Sankarakrishnan .... C23C 16/46 438/758 |

FOREIGN PATENT DOCUMENTS

| | | | |
|---|---|---|---|
| JP | 11121198 A | * | 4/1999 |
| JP | 2000268995 A | * | 9/2000 |
| KR | 20080041889 A | | 5/2008 |
| KR | 20120079961 A | | 7/2012 |
| TW | 201204855 A | | 2/2012 |

OTHER PUBLICATIONS

Office Action from Taiwanese Patent Application No. 102134590 dated Jul. 19, 2017.

* cited by examiner

BOTTOM AND SIDE PLASMA TUNING HAVING CLOSED LOOP CONTROL

CROSS-REFERENCE TO RELATED APPLICATIONS

This application claims benefit of U.S. provisional patent application Ser. No. 61/706,101, filed Sep. 26, 2012, and claims benefit of U.S. provisional patent application Ser. No. 61/726,836 filed Nov. 15, 2012, both of which are herein incorporated by reference.

FIELD

Embodiments described herein relate to semiconductor manufacturing apparatus and methods. Specifically, embodiments described herein relate to plasma processing chambers for semiconductor substrates.

BACKGROUND

For over 50 years, the number of transistors formed on an integrated circuit has doubled approximately every two years. This two-year-doubling trend, also known as Moore's Law, is projected to continue, with devices formed on semiconductor chips shrinking from the current critical dimension of 20-30 nm to below 100 Angstroms in future fabrication processes currently being designed. As device geometries shrink, fabrication geometries grow. As the 300 mm wafer replaced the 200 mm wafer years ago, the 300 mm wafer will shortly be replaced by the 400 mm wafer. With processing of large area semiconductor substrate growing in sophistication, even larger fabrication geometries for logic chips may be within reach.

Uniformity in processing conditions has always been important to semiconductor manufacturing, and as critical dimensions of devices continue to decline and fab geometries increase, tolerance for non-uniformity also declines. Non-uniformity arises from numerous causes, which may be related to device properties, equipment features, and the chemistry and physics of fabrication processes. As the semiconductor manufacturing industry progresses along Moore's Law, there is a continuing need for fabrication processes and equipment capable of very uniform processing.

SUMMARY

Embodiments described herein provide an apparatus for processing a semiconductor substrate, with a processing chamber, a substrate support disposed in the processing chamber, and a lid assembly comprising a conductive gas distributor coupled to a source of electric power. An electrode is positioned between the conductive gas distributor and the body of the processing chamber. The electrode may be a tuning electrode for adjusting plasma conditions in the chamber, and may be an annular member surrounding a portion of the processing volume. The electrode may be coupled to a tuning circuit, which may be an LLC circuit comprising an electronic controller such as a variable capacitor, which may be used to adjust a ground pathway of the processing chamber. An electronic sensor may be used to monitor an electrical condition of the electrode, and may be coupled to the electronic controller for real-time, closed-loop control of plasma conditions One or two electrodes may also be coupled to the substrate support. One electrode may be a bias electrode, and may be coupled to a source of electric power. The other electrode may be a second tuning electrode, and may be coupled to a second tuning circuit having a second electronic sensor and a second electronic controller.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
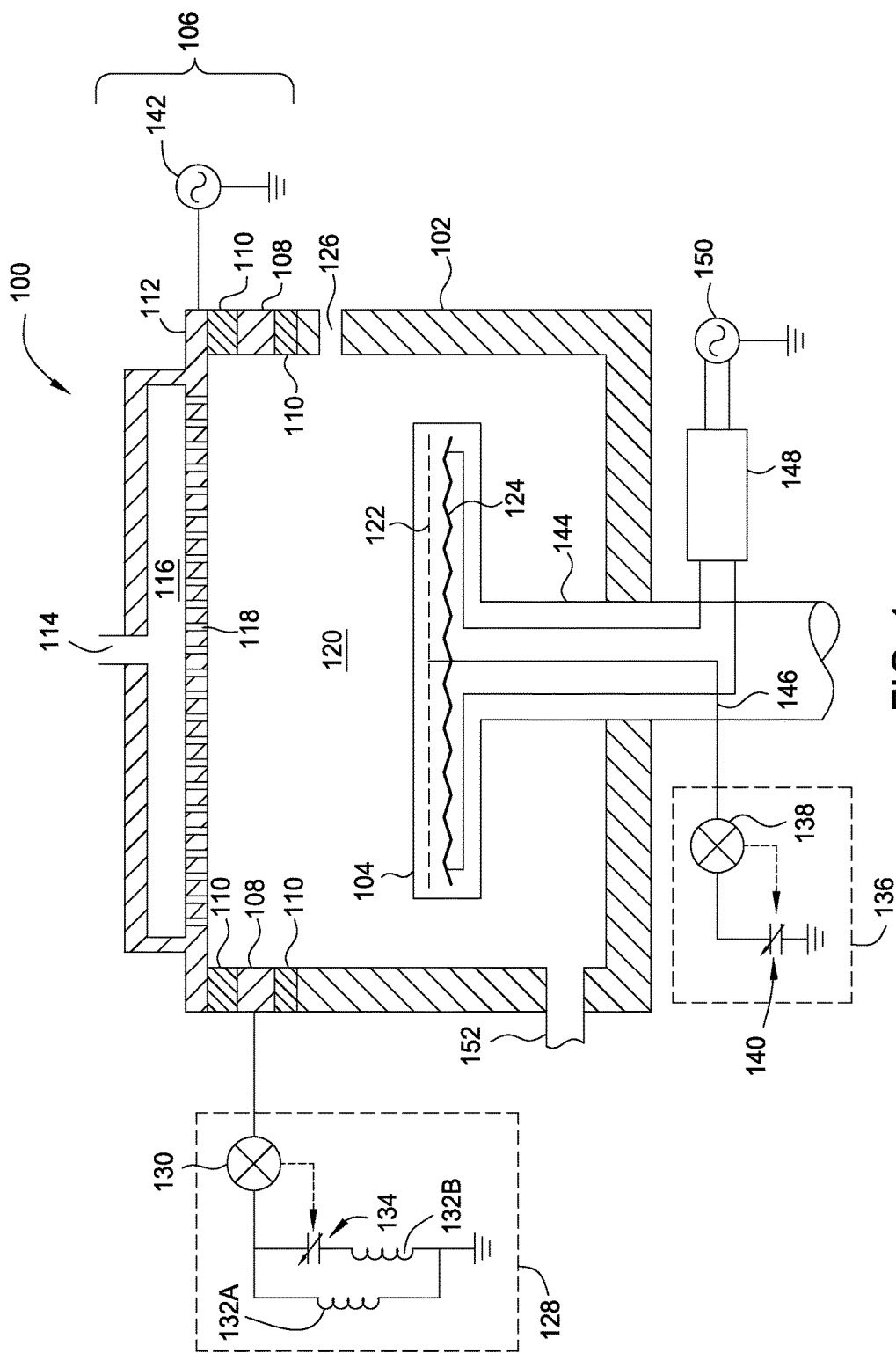
FIG. 1 is a schematic cross-sectional view of a processing chamber according to one embodiment.

Embodiments described herein provide an apparatus for processing a semiconductor substrate. FIG. 1 is a schematic cross-sectional view of a processing chamber 100 according to one embodiment. The processing chamber 100 features a chamber body 102, a substrate support 104 disposed inside the chamber body 102, and a lid assembly 106 coupled to the chamber body 102 and enclosing the substrate support 104 in a processing volume 120. Substrates are provided to the processing volume 120 through an opening 126, which may be conventionally sealed for processing using a door.

An electrode 108 may be disposed adjacent to the chamber body 102 and separating the chamber body 102 from other components of the lid assembly 106. The electrode 108 may be part of the lid assembly 106, or may be a separate side wall electrode. The electrode 108 may be an annular, or ring-like member, and may be a ring electrode. The electrode 108 may be a continuous loop around a circumference of the processing chamber 100 surrounding the processing volume 120, or may be discontinuous at selected locations if desired. The electrode 108 may also be a perforated electrode, such as a perforated ring or a mesh electrode. The electrode 108 may also be a plate electrode, for example a secondary gas distributor.

An isolator 110, which may be a dielectric material such as a ceramic or metal oxide, for example aluminum oxide and/or aluminum nitride, contacts the electrode 108 and separates the electrode 108 electrically and thermally from a gas distributor 112 and from the chamber body 102. The gas distributor 112 features openings 118 for admitting process gas into the processing volume 120. The gas distributor 112 may be coupled to a source of electric power 142, such as an RF generator. DC power, pulsed DC power, and pulsed RF power may also be used.

The gas distributor 112 may be a conductive gas distributor or a non-conductive gas distributor. The gas distributor 112 may also be made of conductive and non-conductive components. For example, a body of the gas distributor 112 may be conductive while a face plate of the gas distributor 112 is non-conductive. In a plasma processing chamber, the gas distributor 112 may be powered, as in the embodiment of FIG. 1 and FIG. 3 below, or the gas distributor 112 may be coupled to ground.

The electrode 108 may be coupled to a tuning circuit 128 that controls a ground pathway of the processing chamber 100. The tuning circuit 128 comprises an electronic sensor 130 and an electronic controller 134, which may be a variable capacitor. The tuning circuit 128 may be an LLC circuit comprising one or more inductors 132. The tuning circuit 128 may be any circuit that features a variable or controllable impedance under the plasma conditions present in the processing volume 120 during processing. In the embodiment of FIG. 1, the tuning circuit 128 features a first inductor 132A in series with the electronic controller 134 and a second inductor 132B in parallel with the electronic controller 134. The electronic sensor 130 may be a voltage or current sensor, and may be coupled to the electronic controller 134 to afford a degree of closed-loop control of plasma conditions inside the processing volume 120.

A second electrode 122 may be coupled to the substrate support 104. The second electrode 122 may be embedded within the substrate support 104 or coupled to a surface of the substrate support 104. The second electrode 122 may be a plate, a perforated plate, a mesh, a wire screen, or any other distributed arrangement. The second electrode 122 may be a tuning electrode, and may be coupled to a second tuning circuit 136 by a conduit 146, for example a cable having a selected resistance such as 50Ω, disposed in a shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled to the second electronic controller 140 to provide further control over plasma conditions in the processing volume 120.

A third electrode 124, which may be a bias electrode and/or an electrostatic chucking electrode, may be coupled to the substrate support 104. The third electrode may be coupled to a second source of electric power 150 through a filter 148, which may be an impedance matching circuit. The second source of electric power 150 may be DC power, pulsed DC power, RF power, pulsed RF power, or a combination thereof.

The lid assembly 106 and substrate support 104 of FIG. 1 may be used with any processing chamber for plasma or thermal processing. One example of a plasma processing chamber with which the lid assembly 106 and substrate support 104 may be beneficially used is the PRODUCER® platform and chambers available from Applied Materials, Inc., located in Santa Clara, Calif. Chambers from other manufacturers may also be used with the components described above.

In operation, the processing chamber 100 affords real-time control of plasma conditions in the processing volume 120. A substrate is disposed on the substrate support 104, and process gases are flowed through the lid assembly 106 using an inlet 114 according to any desired flow plan. Gases exit the chamber 100 through an outlet 152 Electric power is coupled to the gas distributor 112 to establish a plasma in the processing volume 120. The substrate may be subjected to an electrical bias using the third electrode 124, if desired.

Upon energizing a plasma in the processing volume 120, a potential difference is established between the plasma and the first electrode 108. A potential difference is also established between the plasma and the second electrode 122. The electronic controllers 134 and 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers are both variable capacitors, the electronic sensors may adjust the variable capacitors to maximize deposition rate and minimize thickness non-uniformity independently.

Each of the tuning circuits 128 and 136 has a variable impedance that may be adjusted using the respective electronic controllers 134 and 140. Where the electronic controllers 134 and 140 are variable capacitors, the capacitance range of each of the variable capacitors, and the inductances of the inductors 132A and 132B, are chosen to provide an impedance range, depending on the frequency and voltage characteristics of the plasma, that has a minimum in the capacitance range of each variable capacitor. Thus, when the capacitance of the electronic controller 134 is at a minimum or maximum, impedance of the circuit 128 is high, resulting in a plasma shape that has a minimum areal coverage over the substrate support. When the capacitance of the electronic controller 134 approaches a value that minimizes the impedance of the circuit 128, the areal coverage of the plasma grows to a maximum, effectively covering the entire working area of the substrate support 104. As the capacitance of the electronic controller 134 deviates from the minimum impedance setting, the plasma shape shrinks from the chamber walls and areal coverage of the substrate support declines. The electronic controller 140 has a similar effect, increasing and decreasing areal coverage of the plasma over the substrate support as the capacitance of the electronic controller 140 is changed.

The electronic sensors 130 and 138 may be used to tune the respective circuits 128 and 136 in a closed loop. A set point for current or voltage, depending on the type of sensor used, may be installed in each sensor, and the sensor may be provided with control software that determines an adjustment to each respective electronic controller 134 and 140 to minimize deviation from the set point. In this way, a plasma shape can be selected and dynamically controlled during processing. It should be noted that, while the foregoing discussion is based on electronic controllers 134 and 140 that are variable capacitors, any electronic component with adjustable characteristic may be used to provide tuning circuits 128 and 136 with adjustable impedance.

Figure 2:
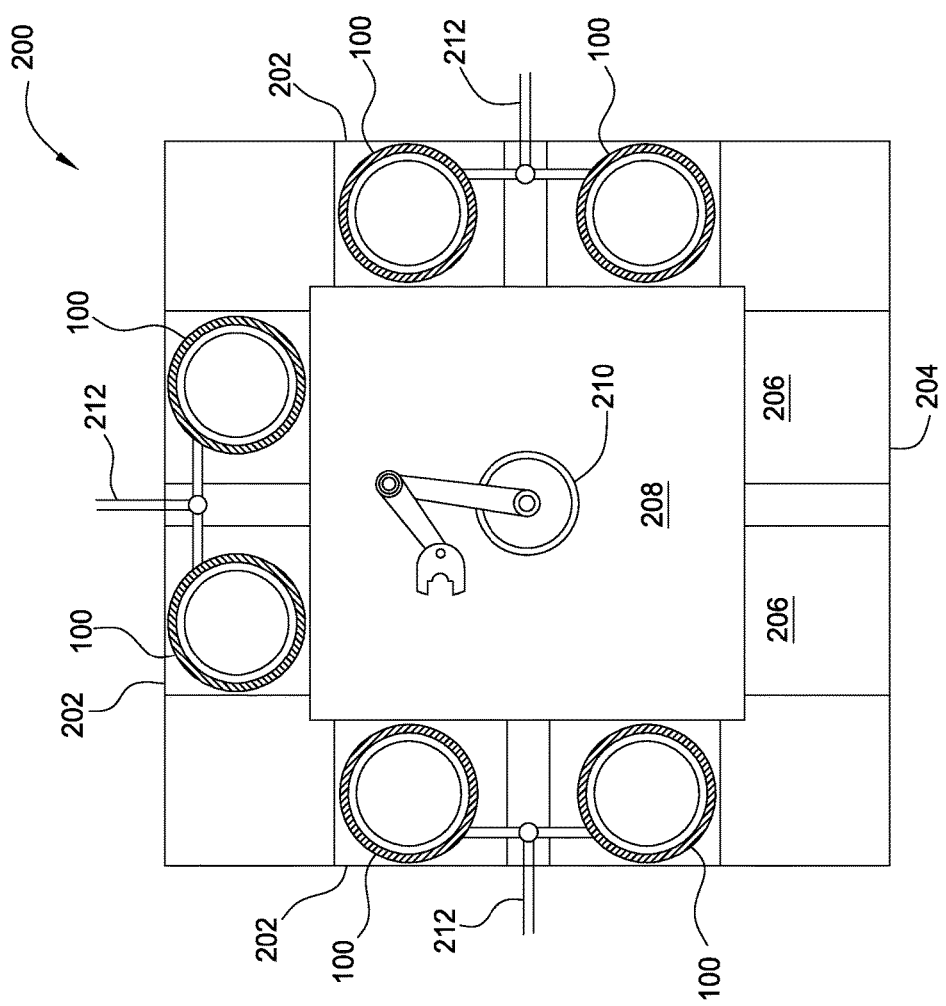
FIG. 2 is a schematic top view of an apparatus 200 according to another embodiment.

FIG. 2 is a schematic top view of an apparatus 200 according to another embodiment. The apparatus 200 is a collection of processing chambers, all of which may be embodiments of the processing chamber 100 of FIG. 1, coupled to a transfer chamber 208 and a load-lock assembly 204. The processing chambers 100 are generally grouped in tandem units 202, each of which has a single supply of process gases 212. The tandem units 202 are positioned around the transfer chamber 208, which typically has a robot 210 for manipulating substrates. The load-locks assembly 204 may feature two load-lock chambers 206, also in a tandem arrangement.

Figure 3:
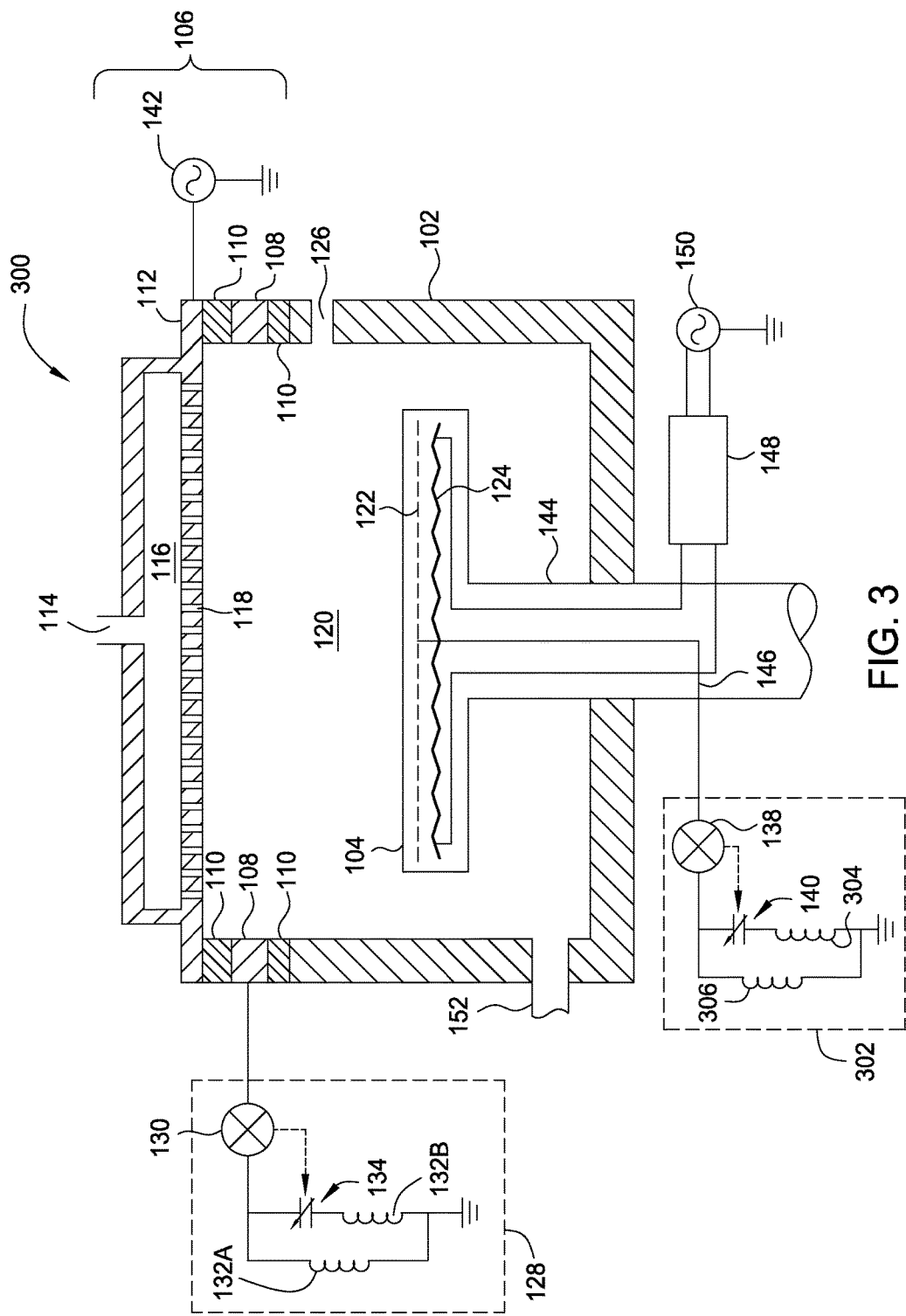
FIG. 3 is a schematic cross-sectional view of a processing chamber according to another embodiment.

FIG. 3 is a schematic cross-sectional view of a processing chamber 300 according to another embodiment. The processing chamber 300 of FIG. 3 is similar in many respects to the processing chamber 100 of FIG. 1, and identical elements are numbered the same in the two figures. The processing chamber 300 features a different tuning circuit 302 coupled to the substrate support 104. The tuning circuit 302 has the same components as the tuning circuit 128, namely the electronic controller 140, the electronic sensor 138, a first inductor 304 in series with the electronic controller 140, and a second inductor 306 in parallel with the electronic controller 140.

The tuning circuit 302 of FIG. 3 works in a manner similar to the tuning circuit 136 of FIG. 1, with different impedance characteristics as the variable component 140 is adjusted. The impedance of the tuning circuit 302 will differ from that of the tuning circuit 136 in a way that depends on the inductances selected for the inductors 304 and 306. Thus, the characteristics of the tuning circuit applied to the substrate support may be adjusted not only by selecting a variable capacitor with a capacitance range that results in an impedance range that is useful in connection with the characteristics of the plasma, but also by selecting inductors to modify the impedance range available using the variable capacitor. As with the tuning circuit 136, the variable capacitor 140 adjusts the impedance of the path to ground through the substrate support, changing the electric potential of the electrode 122 and changing the shape of the plasma in the processing volume 120.

While the foregoing is directed to embodiments of the invention, other and further embodiments of the invention may be devised without departing from the basic scope thereof.

What is claimed is:

1. An apparatus for processing a semiconductor substrate, comprising:
    a processing chamber comprising a chamber body;
    a substrate support disposed in the processing chamber;
    a lid assembly comprising a conductive gas distributor for coupling to a source of electric power, wherein the lid assembly encloses the substrate support in a processing volume; and
    an annular tuning electrode disposed between the chamber body and the conductive gas distributor, wherein the annular tuning electrode is coupled to a tuning circuit, the tuning circuit comprising:
        an electronic sensor having a first terminal and a second terminal, wherein the annular tuning electrode is coupled directly to the first terminal of the electronic sensor;
        an electronic controller having a first terminal coupled directly to the second terminal of the electronic sensor;
        a first inductor having a first terminal coupled directly to a second terminal of the electronic controller and a second terminal coupled to ground; and
        a second inductor having a first terminal coupled directly to the second terminal of the electronic sensor and a second terminal coupled to ground, wherein the second inductor is connected in parallel to the first inductor and the electronic controller.

2. The apparatus of claim 1, wherein the electronic sensor is a voltage sensor or a current sensor.

3. The apparatus of claim 1, wherein the tuning electrode is separated from the conductive gas distributor by an isolator.

4. The apparatus of claim 3, wherein the tuning circuit is a ground pathway of the processing chamber.

5. The apparatus of claim 1, wherein the processing volume is defined from a first side wall of the chamber body to a second side wall of the chamber body and extends uninterrupted from a bottom of the chamber body to a bottom plane of the conductive gas distributor.

6. An apparatus for processing a semiconductor substrate, comprising:
    a processing chamber comprising a chamber body;
    a substrate support disposed in the processing chamber;
    a lid assembly comprising an inlet and a conductive gas distributor for coupling to a source of electric power; and
    an annular side wall electrode disposed between the chamber body and the conductive gas distributor, wherein the annular side wall electrode is coupled to a first impedance tuning circuit, the first impedance tuning circuit comprising:
        a first electronic sensor having a first terminal and a second terminal, wherein the annular side wall electrode is coupled directly to the first terminal of the electronic sensor;
        a first electronic controller having a first terminal coupled directly to the second terminal of the electronic sensor;
        a first inductor having a first terminal coupled directly to a second terminal of the electronic controller and a second terminal coupled to ground; and
        a second inductor having a first terminal coupled directly to the second terminal of the electronic sensor and a second terminal coupled to ground, wherein the second inductor is connected in parallel to the first inductor and the electronic controller.

7. The apparatus of claim 6, wherein the substrate support comprises a bias electrode and a tuning electrode.

8. The apparatus of claim 7, wherein the bias electrode is coupled to a source of electric power and the tuning electrode is coupled to a second impedance tuning circuit.

9. The apparatus of claim 8, wherein the second impedance tuning circuit comprises a second electronic sensor coupled to a second variable capacitor.

10. The apparatus of claim 9, wherein the first electronic sensor and the second electronic sensor are a voltage sensor or a current sensor.

11. The apparatus of claim 10, further comprising a second controller coupled to the second impedance tuning circuit, wherein the second variable capacitor receives a signal from the second electronic sensor and adjusts the second variable capacitor.

12. The apparatus of claim 7, wherein the tuning electrode is coupled to a second impedance matching circuit.

13. The apparatus of claim 12, wherein the annular side wall electrode and the first impedance tuning circuit form a ground pathway for the processing chamber.

14. The apparatus of claim 6, further comprising a first isolator between the annular side wall electrode and the lid assembly and a second isolator between the annular side wall electrode and the chamber body.

15. An apparatus for processing a semiconductor substrate, comprising:
    a processing chamber comprising a chamber body;
    a substrate support disposed in the processing chamber;
    a lid assembly comprising an inlet and a conductive gas distributor for coupling to a source of electric power; and
    an annular side wall electrode disposed between the chamber body and the lid assembly, wherein the annular side wall electrode is coupled to a first impedance tuning circuit, the first impedance tuning circuit comprising:

an electronic sensor having a first terminal and a second terminal, wherein the annular side wall electrode is coupled directly to the first terminal of the electronic sensor;

a variable capacitor having a first terminal coupled directly to the second terminal of the electronic sensor;

a first inductor having a first terminal coupled directly to a second terminal of the variable capacitor and a second terminal coupled to ground; and a second inductor having a first terminal coupled directly to the second terminal of the electronic sensor and a second terminal coupled to ground, wherein the second inductor is connected in parallel to the first inductor and the variable capacitor.

16. The apparatus of claim 15, wherein the substrate support comprises a bias electrode and a tuning electrode.

17. The apparatus of claim 16, wherein the bias electrode is coupled to a source of electric power and the tuning electrode is coupled to a second impedance tuning circuit.

18. The apparatus of claim 17, wherein the second impedance tuning circuit comprises a variable capacitor.

\* \* \* \* \*